United States Patent
Park

(10) Patent No.: US 10,283,213 B2
(45) Date of Patent: May 7, 2019

(54) SEMICONDUCTOR DEVICE FOR DETECTING A POOR CONTACT OF A POWER PAD

(71) Applicant: SK hynix Inc., Icheon-si, Gyeonggi-do (KR)

(72) Inventor: Nak Kyu Park, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 80 days.

(21) Appl. No.: 15/682,162

(22) Filed: Aug. 21, 2017

(65) Prior Publication Data

US 2018/0233212 A1  Aug. 16, 2018

(30) Foreign Application Priority Data

Feb. 10, 2017 (KR) .................. 10-2017-0018830

(51) Int. Cl.
| | |
|---|---|
| G11C 29/12 | (2006.01) |
| G11C 5/06 | (2006.01) |
| G01R 31/28 | (2006.01) |
| G11C 5/14 | (2006.01) |
| H01L 21/66 | (2006.01) |
| H01L 29/423 | (2006.01) |
| H03K 19/0185 | (2006.01) |
| G11C 29/00 | (2006.01) |
| G11C 29/02 | (2006.01) |

(Continued)

(52) U.S. Cl.
CPC .......... *G11C 29/12* (2013.01); *G01R 31/2853* (2013.01); *G11C 5/063* (2013.01); *G11C 5/14* (2013.01); *G11C 29/006* (2013.01); *G11C 29/021* (2013.01); *G11C 29/1201* (2013.01); *G11C 29/46* (2013.01); *H01L 22/30* (2013.01); *H01L 29/42372* (2013.01); *H03K 19/018571* (2013.01); *G11C 7/20* (2013.01); *G11C 29/48* (2013.01); *G11C 2029/0407* (2013.01); *G11C 2029/5004* (2013.01); *G11C 2029/5602* (2013.01)

(58) Field of Classification Search
CPC ..... G01R 31/04; G01R 31/2853; G11C 29/12
USPC ........................................ 324/76.11; 365/201
See application file for complete search history.

(56) References Cited

U.S. PATENT DOCUMENTS

| | | | | |
|---|---|---|---|---|
| 6,774,663 | B2 * | 8/2004 | Moreaux ............. | G01R 31/043 235/492 |
| 6,897,666 | B2 * | 5/2005 | Swettlen ............ | G01R 1/07378 324/754.07 |

(Continued)

FOREIGN PATENT DOCUMENTS

| KR | 1020020057358 A | 7/2002 |
|---|---|---|
| KR | 1020150131953 A | 11/2015 |

*Primary Examiner* — Son L Mai
(74) *Attorney, Agent, or Firm* — William Park & Associates Ltd.

(57) ABSTRACT

A semiconductor device may include a first pad configured to provide a first voltage. The semiconductor device may include a second pad. The semiconductor device may include a connection circuit configured to couple the first pad to the second pad on the basis of a connection signal or electrically separate the second pad from the first pad on the basis of the connection signal. The semiconductor device may include a detection circuit configured to generate a defect detection signal on the basis of a test mode signal and a second voltage received from the second pad.

20 Claims, 10 Drawing Sheets

(51) Int. Cl.
  *G11C 29/46* (2006.01)
  *G11C 7/20* (2006.01)
  *G11C 29/48* (2006.01)
  *G11C 29/04* (2006.01)
  *G11C 29/50* (2006.01)
  *G11C 29/56* (2006.01)

(56) References Cited

U.S. PATENT DOCUMENTS

| | | | |
|---|---|---|---|
| 7,368,960 B2 * | 5/2008 | Li | G01R 19/16552 327/143 |
| 7,609,080 B2 * | 10/2009 | Miller | G01R 1/36 324/757.01 |
| 7,952,371 B2 * | 5/2011 | Nagasawa | G01R 31/2853 324/750.3 |
| 8,754,632 B2 * | 6/2014 | Sugiyama | H01L 27/0274 324/76.11 |
| 8,922,222 B2 * | 12/2014 | Anand | G06F 11/3055 324/538 |
| 2015/0333022 A1 | 11/2015 | Albers et al. | |

* cited by examiner

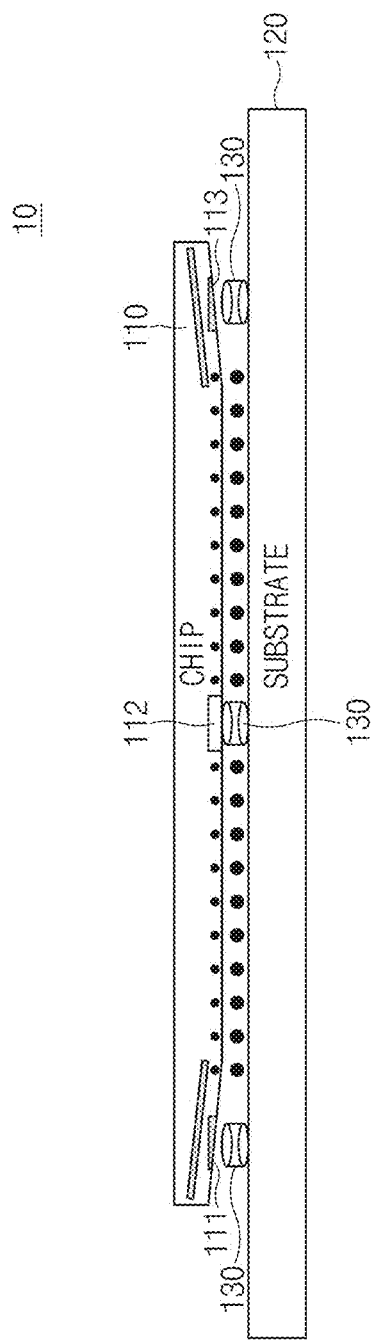

| | NORMAL CONNECTION | | ABNORMAL CONNECTION | |
|---|---|---|---|---|
| VPD1 | VDD | | Floating | |
| TM | L | H | L | H |
| P1 | On(CONNECTION) | Off(SEPARATION) | On(CONNECTION) | Off(SEPARATION) |
| TM_B | H | L | H | L |
| N2 | On | Off | On | Off |
| P2 | Off | On | Off | On |
| VOUT | L | H | L | L HOLD |
| VALERT | H | L | H | H(detection) |
| Mux | 0 | 1 | 0 | 1 |

FIG. 4

|  | NORMAL CONNECTION | | ABNORMAL CONNECTION | |
|---|---|---|---|---|
| VPD1 | VSS | | Floating | |
| TM | L | H | L | H |
| N3 | On(CONNECTION) | Off(SEPARATION) | On(CONNECTION) | Off(SEPARATION) |
| P4 | On | Off | On | Off |
| N4 | Off | On | Off | On |
| VOUT | L | H | L | L HOLD |
| VALERT | H | L | H | H(detection) |
| Mux | 0 | 1 | 0 | 1 |

SEMICONDUCTOR DEVICE FOR DETECTING A POOR CONTACT OF A POWER PAD

CROSS-REFERENCE TO RELATED APPLICATION

This application claims priority based upon Korean patent application No. 10-2017-0018830, filed on Feb. 10, 2017, the disclosure of which is hereby incorporated in its entirety by reference herein.

BACKGROUND

1. Technical Field

Embodiments of the present disclosure may generally relate to a semiconductor device, and more particularly, to a semiconductor device relating to a pad.

2. Related Art

Occurrence of a curved wafer caused by an unstable fabrication process of the wafer is referred to as warpage. Various defects may occur in the semiconductor device due to the warpage. As a representative example, a poor contact of a power pad may occur in the semiconductor.

SUMMARY

In accordance with an embodiment of the present disclosure, a semiconductor device may be provided. The semiconductor device may include a first pad configured to provide a first voltage. The semiconductor device may include a second pad. The semiconductor device may include a connection circuit configured to couple the first pad to the second pad on the basis of a connection signal or electrically separate the second pad from the first pad on the basis of the connection signal. The semiconductor device may include a detection circuit configured to generate a defect detection signal on the basis of a test mode signal and a second voltage received from the second pad.

BRIEF DESCRIPTION OF THE DRAWINGS

FIG. 1A is a view illustrating a representation of an example of a poor contact of a power pad caused by a warpage of a semiconductor device according to an embodiment of the present disclosure.

FIG. 4 is a view illustrating a representation of an example of a table indicating operations or voltage levels of individual constituent elements of the semiconductor device illustrated in FIG. 3.

FIG. 6 is a view illustrating a representation of an example of a table indicating operations or voltage levels of individual constituent elements of the semiconductor device illustrated in FIG. 5.

DETAILED DESCRIPTION

Figure 1B:
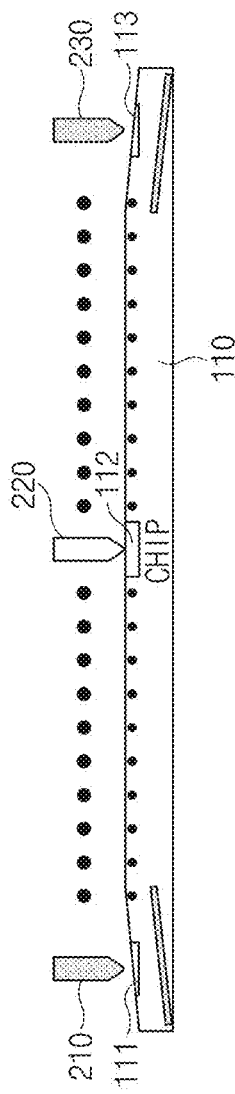
FIG. 1B is a view illustrating a representation of an example for detecting a poor contact of a semiconductor device using a test device.

Various embodiments of the present disclosure may be directed to providing a semiconductor device that substantially obviates one or more problems due to limitations and disadvantages of the related art.

Embodiments of the present disclosure may generally relate to a semiconductor device for detecting poor contact of a power pad in advance.

Reference will now be made in detail to the embodiments of the present disclosure, examples of which are illustrated in the accompanying drawings. Wherever possible, the same reference numbers will be used throughout the drawings to refer to the same or like parts.

FIG. 1A is a view illustrating a representation of an example of a poor contact of a power pad caused by a warpage of a semiconductor device 10 according to an embodiment of the present disclosure.

Referring to FIG. 1A, the semiconductor device 10 may include a semiconductor chip 110 and a semiconductor substrate 120. The semiconductor chip 110 may include a power pad 111, 112, and 113 to provide a power-supply voltage to the inside thereof, and may contact the semiconductor substrate 120 through contact members 130 respectively formed at specific positions corresponding to the power pads 111, 112, and 113. The connection member 130 may be formed of a bonding material. The power pads 111, 112, and 113 may be bonded to the semiconductor substrate 120 by the connection member 130.

However, referring to FIG. 1A, if the semiconductor chip 110 is curved due to warpage thereof, only some parts of the power pad 112 may be bonded to the semiconductor substrate 120, and the remaining power pads 111 and 113 may not be bonded to the semiconductor substrate 120. In this case, power may not be supplied to the semiconductor chip 110 through the power pads 111 and 113, such that it may be difficult for the semiconductor chip 110 to stably operate.

FIG. 1B is a view illustrating a representation of an example for detecting a poor contact of a semiconductor device 110 using a test device.

Referring to FIG. 1B, the test device (not illustrated) may include a plurality of probe needles 210, 220, and 230. The test device may provide a power-supply voltage to the power pads 111, 112, and 113 through the probe needles 210, 220, and 230.

In this case, the semiconductor chip 110 is curved and the probe needles 210 and 230 respectively contact the power pads 111 and 113, such that a power-supply voltage is not supplied to the power pads 111 and 113. However, since the probe needle 220 contacts the power pad 112, a power-supply voltage may be supplied to the semiconductor chip 110 through the power pad 112. Therefore, since the semiconductor chip 110 outputs a normal signal, it may be impossible for the semiconductor chip 110 to detect poor contact of the power pads 111 and 113.

Figure 2:
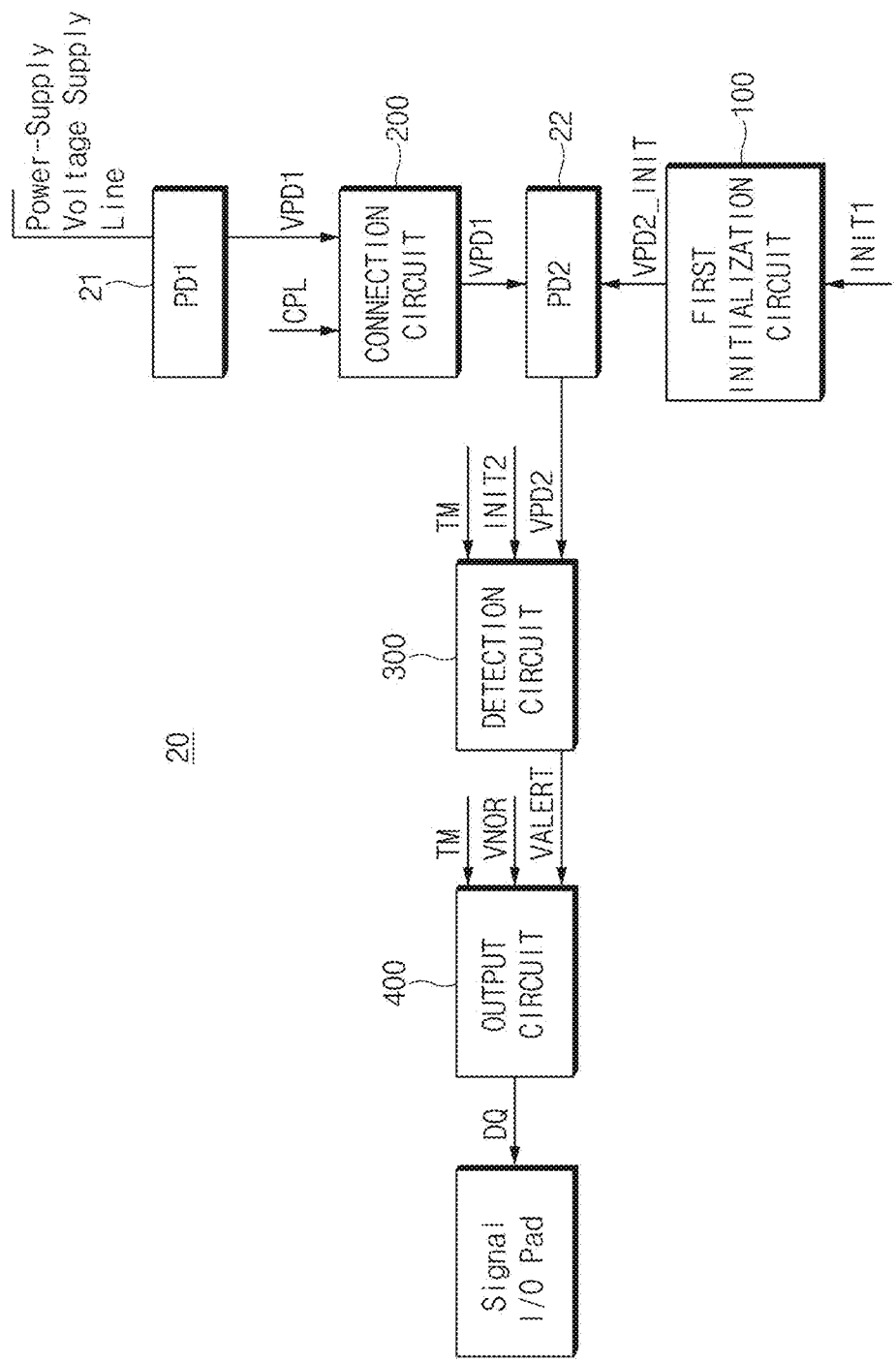
FIG. 2 is a block diagram illustrating a representation of an example of a semiconductor device according to an embodiment of the present disclosure.

FIG. 2 is a block diagram illustrating a representation of an example of a semiconductor device 20 according to an embodiment of the present disclosure. Referring to FIG. 2, the power pad contained in the semiconductor device 20 may include first pads PD1 and 21 coupled to a power-supply voltage supply line and second pads PD2 and 22 capable of being separated from the first pad 21. The semiconductor device 20 may include a first initialization circuit 100, a connection circuit 200, a detection circuit 300, and an output circuit 400.

The first initialization circuit 100 may generate an initial second voltage VPD2_INIT on the basis of a first initialization signal INIT1. The initial second voltage VPD2_INT may be a value for establishing an initialization value of a second voltage VPD2. The initial second voltage VPD2_INIT may be a voltage level opposite to that of the first pad 21.

For example, if the first pad 21 is coupled to a power-supply voltage supply line during a normal connection state, the initial second voltage VPD2_INT may be a ground voltage level. For example, if the first pad 21 is coupled to a ground-voltage supply line in the normal connection state, the initial second voltage VPD2_INIT may be a power-supply voltage level.

The connection circuit 200 may output the first voltage VPD1 to the second pad 22 on the basis of a connection signal CPL. The connection circuit 200 may output the first voltage VPD1 to the second pad 22 by coupling the first pad 21 to the second pad 22. Therefore, the first voltage VPD1 of the first pad 21 is applied to the second pad 22, such that the first voltage VPD1 is substantially identical to the second voltage VPD2. That is, the connection circuit 200 may allow the second voltage VPD2 to be substantially identical to the first voltage VPD1. The connection signal CPL may be enabled after the first initialization signal INIT1 is enabled for a predetermined time. The connection signal CPL may be a low enable signal. For example, assuming that the first pad 21 is normally bonded to (or normally contacts) the power-supply voltage supply line when the first pad 21 is coupled to the power-supply voltage supply line during the normal connection state, the first voltage VPD1 may have a power-supply voltage (VDD) level. If the first initialization signal INIT1 is enabled, the first initialization circuit 100 may set the initial second voltage VPD2_INIT to a ground voltage (VSS) level corresponding to an opposite level of the first voltage VPD1 during the normal state.

Thereafter, if the first initialization signal INIT1 is disabled and the connection signal CPL is enabled, the connection circuit 200 may allow the second voltage VPD2 to have the power-supply voltage (VDD) level substantially identical to the first voltage VPD1 by connecting the first pad 21 to the second pad 22. That is, the second voltage VPD2 may be set to the ground voltage (VSS) level by the first initialization circuit 100, and may then transition to the power-supply voltage (VDD) level by the connection circuit 200.

Assuming that there arises a poor contact (poor bonding) between the first pad 21 and the power-supply voltage supply line of the semiconductor substrate 120 when the first pad 21 is coupled to the power-supply voltage supply line during the normal connection state, the first voltage VPD1 may be floated. In this case, when the connection signal CPL is enabled, the connection circuit 200 may couple the first pad 21 to the second pad 22 and the second voltage VPD2 may be set to a ground voltage (VSS) level by the first initialization circuit 100, such that the second voltage VPD2 may remain at the ground voltage (VSS) level even when the first voltage VPD1 floated on the second pad 22 is supplied to the semiconductor device 10 by the connection circuit 200.

In addition, assuming, for example, that the first pad 21 is normally bonded to (or normally contacts) the ground-voltage supply line of the semiconductor substrate 120 when the first pad 21 is connected to the ground-voltage supply line during the normal connection state, the first voltage VPD1 has a ground voltage (VSS) level. If the first initialization signal INIT1 is enabled, the first initialization circuit 100 may set the initial second voltage VPD2_INIT to the power-supply voltage (VDD) level corresponding to an opposite level of the first voltage VPD1 during the normal connection state.

Thereafter, when the first initialization signal INIT1 is disabled and the connection signal CPL is enabled, the connection circuit 200 may allow the second voltage VPD2 to have the ground voltage (VSS) level substantially identical to the first voltage VPD1 by coupling the first pad 21 to the second pad 22. That is, the second voltage VPD2 may be set to the power-supply voltage (VDD) level by the first initialization circuit 100, and may then transition to the power-supply voltage (VSS) level by the connection circuit 200.

Assuming that there arises a poor contact (poor bonding) between the first pad 21 and the power-supply voltage supply line of the semiconductor substrate 120 when the first pad 21 is coupled to the power-supply voltage supply line in the normal connection state, the first voltage VPD1 may be floated. In this case, assuming that the connection signal CPL is enabled, the second voltage VPD2 is set to the power-supply voltage (VDD) level by the first initialization circuit 100 even when the first pad 21 is coupled to the second pad 22 by the connection circuit 200. As a result, the second voltage VPD2 may remain at the power-supply voltage (VDD) level even when the first voltage VPD1 floated on the second pad 22 is supplied to the semiconductor device 10.

That is, assuming that contact (bonding) of the first pad 21 is considered normal when the power-supply voltage is supplied to the semiconductor device 10 through the first pad 21, the connection circuit 200 may generate the second voltage VPD2 having the power-supply voltage (VDD) level. In contrast, assuming that contact (bonding) of the first pad 21 is considered abnormal when the power-supply voltage is supplied to the semiconductor device 10 through the first pad 21, the connection circuit 200 may generate the second voltage VPD2 having the ground voltage (VSS) level. In addition, assuming that contact (bonding) of the first pad 21 is considered normal when the ground voltage is supplied to the semiconductor device 10 through the first pad 21, the connection circuit 200 may generate the second voltage VPD2 having the ground voltage (VSS) level. In contrast, assuming that contact (bonding) of the first pad 21 is considered abnormal, the connection circuit 200 may generate the second voltage VPD2 having the power-supply voltage (VDD) level.

The detection circuit 300 may generate a defect detection signal VALERT on the basis of a test mode signal TM and the second voltage VPD2. In addition, the detection circuit 300 may establish an initial value of an internal voltage VOUT (See FIGS. 3 and 5) of the detection circuit 300 on the basis of the second initialization signal INIT2. The test mode signal TM may be enabled after the second initialization signal INIT2 is enabled for a predetermined time. The second initialization signal INIT2 may be an inversion signal of the test mode signal TM. The test mode signal TM may be identical to the connection signal CPL.

For example, assuming that the test mode signal TM is enabled and the second voltage VPD2 is at a ground voltage (VSS) level when the power-supply voltage is supplied to the semiconductor device through the first pad 21 in a normal state, the detection circuit 300 may enable the defect detection signal VALERT. Assuming that the test mode signal TM is enabled and the second voltage VPD2 is at a power-supply voltage (VDD) level when the power-supply voltage is supplied to the semiconductor device through the first pad 21, the detection circuit 300 may disable the defect detection signal VALERT.

Assuming that the test mode signal TM is enabled and the second voltage VPD2 is at a power-supply voltage (VDD) level when the ground voltage is supplied to the semiconductor device through the first pad 21 in the normal state, the detection circuit 300 may enable the defect detection signal VALERT. Assuming that the test mode signal TM is enabled and the second voltage VPD2 is at a ground voltage (VSS) level when the ground voltage is supplied to the semiconductor device through the first pad 21 in the normal state, the detection circuit may disable the defect detection signal VALERT.

The output circuit 400 may output the defect detection signal VALERT serving as a data DQ signal to the outside of the semiconductor device 20 on the basis of the test mode signal TM. For example, when the test mode signal TM is enabled, the output circuit 400 may output the defect detection signal VALERT to a signal input and output (input/output) (I/O) pad contained in the semiconductor device 20. When the test mode signal TM is disabled, the output circuit 400 may output a normal signal VNOR to the signal input and output I/O pad.

Figure 3:
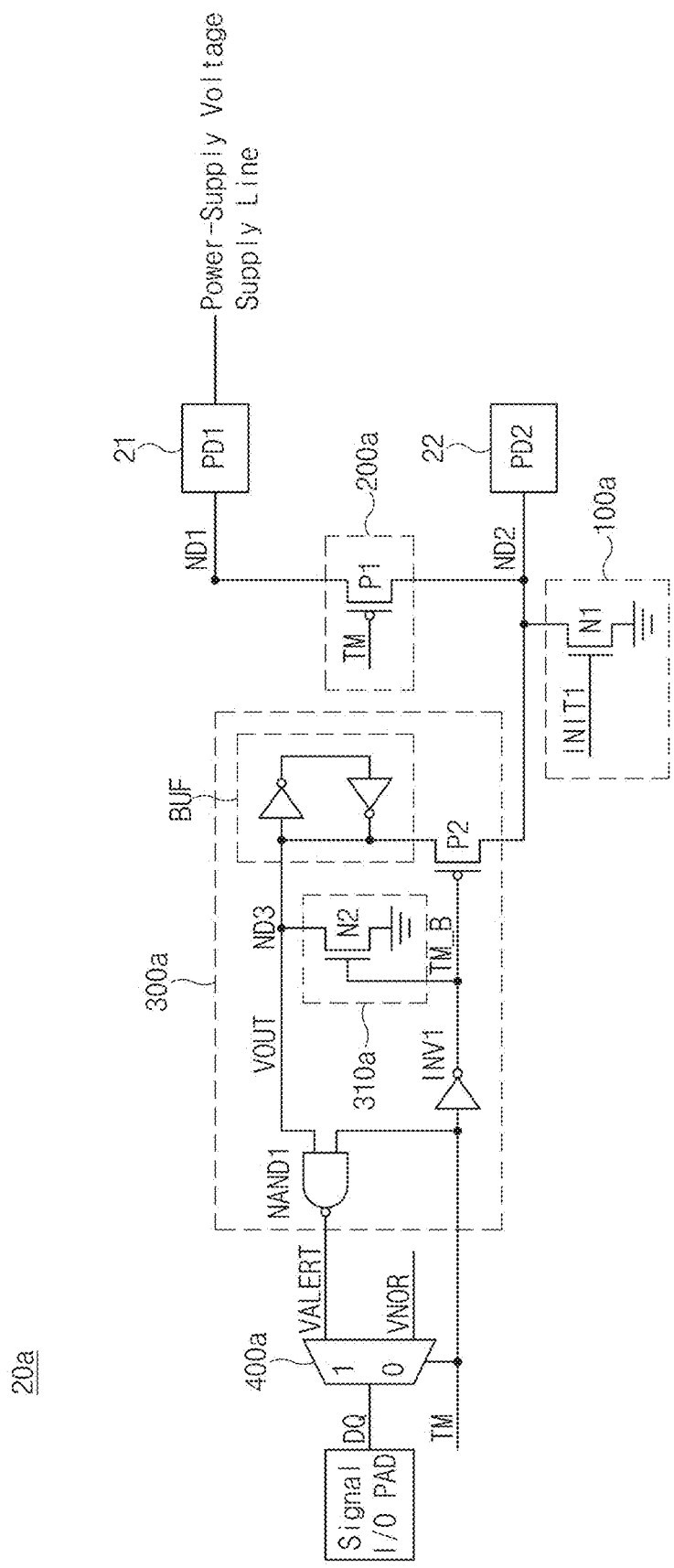
FIG. 3 is a circuit diagram illustrating a representation of an example of the semiconductor device illustrated in FIG. 2.

FIG. 3 is a circuit diagram illustrating a representation of an example of the semiconductor device illustrated in FIG. 2. For example, FIG. 3 illustrates an example in which the first pad 21 is coupled to the power-supply voltage supply line of the semiconductor device 120 when the first pad 21 normally contacts (or is normally bonded to) the semiconductor substrate. Referring to FIG. 3, a semiconductor device 20a may include a first initialization circuit 100a, a connection circuit 200a, a detection circuit 300a, and an output circuit 400a in the same manner as in the semiconductor device 20 of FIG. 2.

Referring to FIG. 3, the first initialization circuit 100a may include an NMOS transistor N1 in which a gate terminal receives the first initialization signal INIT1, a source terminal receives a ground voltage, and a drain terminal is coupled to a second node ND2. In this case, the second node ND2 may be coupled to the second pad 22. Therefore, a voltage of the second node ND2 (i.e., a drain voltage of the NMOS transistor N1) may be a voltage VPD2 of the second pad 22.

If the first initialization signal INIT1 is enabled by the above-mentioned constituent elements, the first initialization circuit 100a may discharge electric potential of a first node ND1 by turning on the NMOS transistor N1, such that the second voltage VPD2 may be initialized to the ground voltage (VSS) level.

Referring to FIG. 3, the connection circuit 200a may include a PMOS transistor P1 in which a gate terminal receives a test mode signal TM, a source terminal is coupled to the second node ND2, and a drain terminal is coupled to the first node ND1. In accordance with a present embodiment, the test mode signal TM serving as the connection signal CPL of FIG. 2 may be applied to the connection circuit 200a. After the first initialization signal INIT1 is disabled from a logic high level to a logic low level, the test mode signal TM may begin to be supplied to the connection circuit 200a and may transition from a logic low level to a logic high level. In other words, after the first initialization signal INIT1 is disabled, the test mode signal TM may begin to be supplied to the connection circuit 200a. When the test mode signal TM is at a low level, the test mode signal TM may turn on the PMOS transistor P1, such that the test mode signal TM may be used as the connection signal CPL of FIG. 2.

The first pad 21 may be coupled to the first node ND1. Therefore, the voltage of the first node ND1 (i.e., a source voltage of the PMOS transistor P1) may be identical to the power-supply voltage (VDD) level when the first pad 21 normally contacts (is normally bonded to) the power-supply voltage supply line of the semiconductor device 120 (i.e., when poor contact occurs between the first pad 21 and the power-supply voltage supply line of the semiconductor device 120 does not occur). However, when the first pad 21 is abnormally coupled to the power-supply voltage supply line of the substrate (i.e., when there arises a poor contact (poor bonding) between the first pad 21 and the power-supply voltage supply line of the substrate), the voltage of the first node ND1 may be floated. Before the test mode signal TM is enabled (i.e., when the test mode signal TM is at a low level), the connection circuit 200a may couple the first node ND1 to the second node ND2. Therefore, when the first pad 21 is normally coupled to the power-supply voltage supply line of the substrate, the voltage of the second node ND2 may be the power-supply voltage (VDD) level. However, assuming that the first pad 21 is abnormally coupled to the power-supply voltage supply line of the substrate, the second node ND2 is previously set to the ground voltage (VSS) level although the floated first node ND1 is coupled to the second node ND2, such that a voltage of the second node ND2 (i.e., the second voltage VPD2) may remain at the ground voltage (VSS) level.

Referring to FIG. 3, the detection circuit 300a may include an inverter INV1 configured to generate an inversion test mode signal (TM_B) upon receiving the test mode signal TM; a second PMOS transistor P2 in which a gate terminal receives the inversion test mode signal TM_B, a drain terminal is coupled to the second node ND2, and a source terminal is coupled to a third node ND3; a buffer BUF coupled to the third node ND3 to maintain a voltage (i.e., an output voltage VOUT) of the third node ND3; and a NAND operator NAND1 configured to generate the defect detection signal VALERT by performing a NAND operation between the test mode signal TM and the output voltage VOUT. When the test mode signal TM is enabled by the above-mentioned structure, the second PMOS transistor P2 of the detection circuit 300a is turned on, a voltage (i.e., a second voltage VPD2) of the second node ND2 is output as the voltage of the third node ND3 (i.e. output voltage VOUT). Accordingly, during normal connection of the first pad 21, the output voltage VOUT may have the power-supply voltage (VDD) level, and the defect detection signal VALERT may have a logic low level. However, during abnormal connection of the first pad 21, the output voltage VOUT may have the ground voltage (VSS) level, and the defect detection signal VALERT may have a logic high level.

Referring to FIG. 3, the detection circuit 300a may further include a second initialization circuit 310a having a second NMOS transistor N2 in which a gate terminal receives an inversion test mode signal TM_B, a source terminal receives a ground voltage, and a drain terminal is coupled to the third node ND3. In accordance with a present embodiment, the inversion test mode signal TM_B may be used as the second initialization signal INIT2 of FIG. 2. As described above, since the test mode signal TM transitions from a low level state to a high level state, the inversion test mode signal TM_B may transition from a high level state to a low level state. Therefore, since the test mode signal TM is enabled to a high level after the inversion test mode signal TM_B is enabled to a high level for a predetermined time, the inversion test mode signal TM_B may be used as the second initialization signal INIT2. Accordingly, before the test mode signal TM is enabled (i.e., when the inversion test mode signal TM_B is enabled), the second NMOS transistor N2 is turned on, such that the voltage (i.e., output voltage VOUT) of the third node ND3 may be initialized to the ground voltage (VSS) level.

Referring to FIG. 3, the output circuit 400a may be a multiplexer MUX configured to output any one of the defect detection signal VALERT and a normal signal VNOR to the signal I/O pad on the basis of the test mode signal TM. The normal signal VNOR may represent any of signals other than the defect detection signal VALERT that is output through the signal I/O pad. For example, when the test mode signal TM is enabled, the output circuit 400a may output the defect detection signal VALERT to the signal I/O pad. When the test mode signal TM is disabled, the output circuit 400a may output the normal signal VNOR to the signal I/O pad.

FIG. 4 is a view illustrating a representation of an example of a table indicating operations or voltage levels of individual constituent elements of the semiconductor device 20a illustrated in FIG. 3.

First, for example, a case in which the first pad 21 is normally coupled (bonded) to the power-supply voltage supply line of the substrate will hereinafter be described with reference to FIG. 4.

If the first pad 21 is normally coupled to the power-supply voltage supply line of the substrate, the first voltage VPD1 may be the power-supply voltage (VDD) level. When the test mode signal TM is disabled, the first PMOS transistor P1 is turned on such that the first node ND1 is coupled to the second node ND2. Therefore, the second voltage VPD2 may be the power-supply voltage (VDD) level. When the test mode signal TM is disabled, the second NMOS transistor N2 is turned on such that the output voltage VOUT is initialized to the ground voltage (VSS) level. In this case, the second PMOS transistor P2 is turned off such that the second voltage VPD2 may not be output as the output voltage VOUT. Whereas the defect detection signal VALERT is at a high level because the output voltage VOUT has the ground voltage (VSS) level (i.e., L), the test mode signal TM is disabled (i.e., L), such that the multiplexer MUX may not output the defect detection signal VALERT.

When the test mode signal TM transitions from a low level to a high level, the first PMOS transistor P1 is turned off so that the first node ND1 and the second node ND2 are separated from each other. The second PMOS transistor P2 is turned on, such that the second node ND2 is coupled to the third node ND3. Accordingly, the second voltage VPD2 of the power-supply voltage (VDD) level may be output as the output voltage VOUT. In this case, the second NMOS transistor N2 is turned off. The output voltage is at the power-supply voltage (VDD) level and the test mode signal TM is enabled (i.e., H), such that the defect detection signal VALERT may be at a low level. The multiplexer MUX may output a low-level defect detection signal VALERT to the signal I/O pad.

Subsequently, the other case in which the first pad 21 is abnormally coupled (bonded) to the power-supply voltage supply line of the substrate will hereinafter be described with reference to FIG. 4.

When the first pad 21 is abnormally coupled to the power-supply voltage supply line of the substrate, the first voltage VPD1 may be floated. The first PMOS transistor P2 is turned on when the test mode signal TM is disabled (i.e., L), such that the first node ND1 is coupled to the second node ND2. Since the second voltage VPD2 is previously initialized to the ground voltage (VSS) level by the first NMOS transistor N1, the second voltage VPD2 may remain at the ground voltage (VSS) level even when the first node ND1 is coupled to the second node ND2. The second NMOS transistor N2 is turned on when the test mode signal TM is disabled, the output voltage VOUT may be initialized to the ground voltage (VSS) level (i.e., a low level). In this case, since the second PMOS transistor P2 is turned off, the second voltage VPD2 may not be output as the output voltage VOUT. Whereas the defect detection signal VALERT is at a high level (i.e., H) because the output voltage VOUT is at the ground voltage (VSS) level, the multiplexer MUX may not output the defect detection signal VALERT because the test mode signal TM is disabled.

If the test mode signal TM transitions from a low level to a high level, the first PMOS transistor P1 is turned off, such that the first node ND1 and the second node ND2 are separated from each other. The second PMOS transistor P2 is turned on, such that the second node ND2 is coupled to the third node ND3. Accordingly, the output voltage VOUT may remain at the ground voltage (VSS) level (i.e., a low level). In this case, the second NMOS transistor N2 may be turned off. Since the output voltage VOUT is at a low level and the test mode signal TM is enabled, the defect detection signal VALERT is at a high level. The multiplexer MUX may output a high-level defect detection signal VALERT to the signal I/O pad.

As described above, assuming that the defect detection signal VALERT remains at a high level even when the test mode signal TM is enabled by the semiconductor device 20a of FIG. 3, the presence of a poor contact of the first pad 21 may be decided.

Figure 5:
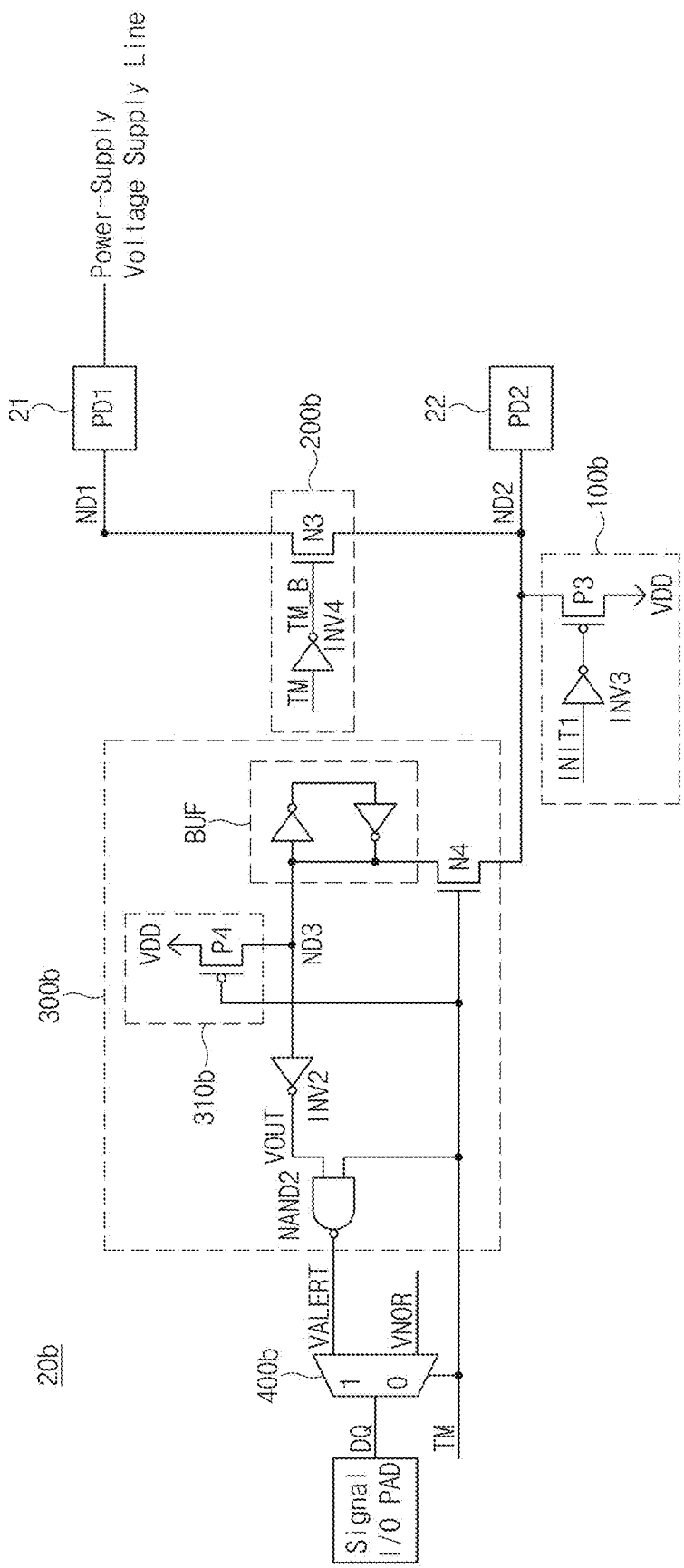
FIG. 5 is a circuit diagram illustrating a representation of an example of the semiconductor device illustrated in FIG. 2.

FIG. 5 is a circuit diagram illustrating a representation of an example of the semiconductor device illustrated in FIG. 2. FIG. 5 illustrates, for example, a case in which the first pad 21 is coupled to the ground-voltage supply line when the first pad 21 normally contacts (or is normally bonded to) the substrate. Referring to FIG. 5, the semiconductor device 20b may include a first initialization circuit 100b, a connection circuit 200b, a detection circuit 300b, and an output circuit 400b in the same manner as in the semiconductor device 20 of FIG. 2.

Referring to FIG. 5, the first initialization circuit 100b may include an inverter INV3 configured to generate an inversion signal of the first initialization signal INIT1; and a third PMOS transistor P3 in which a gate terminal receives the inversion signal of the first initialization signal INIT1, a drain terminal receives the power-supply voltage VDD, and a source terminal is coupled to the second node ND2. If the first initialization signal INIT1 is enabled to a high level by the above-mentioned constituent elements, the third PMOS transistor P3 is turned on by the inversion signal of the first initialization signal INIT1 to charge the second node ND2, the second voltage VPD2 may be initialized to the power-supply voltage (VDD) level.

Referring to FIG. 5, the connection circuit 200b may include an inverter INV4 configured to generate an inversion test mode signal TM_B upon receiving the test mode signal TM; and a third NMOS transistor N3 in which a gate terminal receives the inversion test mode signal TM_B, a source terminal is coupled to the second node ND2, and a drain terminal is coupled to the first node ND1. The test mode signal TM may transition from a low level state to a high level state at an early stage. In accordance with a present embodiment, the test mode signal TM may be used as the connection signal CPL of FIG. 2. The test mode signal TM may begin to be applied to the semiconductor device after the first initialization signal INIT1 is disabled from a high level to a low level, and may be disabled from a low enable state to a high disable state at an early stage. For example, the test mode signal TM may begin to be applied to the semiconductor device after the first initialization signal INIT1 is disabled from a high level to a low level. When the test mode signal TM is at a low level, the test mode signal TM turns on the NMOS transistor N3, such that the test mode signal TM may be used as the connection signal CPL of FIG. 2.

The first pad 21 is coupled to the first node ND1. Therefore, when the first pad 21 is normally coupled to the ground-voltage supply line of the semiconductor substrate 120 (i.e., when there is no poor contact (no poor bonding) between the first pad 21 and the ground voltage supply line of the semiconductor substrate 120), a voltage of the first node ND1 may be the ground voltage (VSS) level. When the first pad 21 is abnormally coupled to the ground-voltage supply line of the semiconductor substrate 120 (i.e., when there is a poor contact (poor bonding) between the first pad 21 and the ground-voltage supply line), the voltage of the first node ND1 may be floated. Before the test mode signal TM is enabled (i.e., when the test mode signal TM is at a low level), the connection circuit 200b may couple the first node ND1 to the second node ND2. Therefore, during normal connection of the first pad 21, the voltage of the second node ND2 (i.e., the second voltage VPD2) may be the ground voltage (VSS) level. In contrast, during abnormal connection of the first pad 21, the second node ND2 is previously initialized to the power-supply voltage (VDD) level although the floated first node ND is connected to the second node ND2, such that the voltage of the second node ND2 (i.e., the second voltage VPD2) may remain at the power-supply voltage (VDD) level.

Referring to FIG. 5, the detection circuit 300b may include a fourth NMOS transistor N4 in which a gate terminal receives the test mode signal TM, a source terminal is coupled to the second node ND2, and a drain terminal is coupled to the third node ND3; a buffer BUF connected to the third node ND3 to maintain the voltage of the third node ND3; a second inverter INV2 configured to generate the output voltage VOUT by inverting the voltage of the third node ND3; and a NAND operator NAND2 configured to generate the defect detection signal VALERT by performing a NAND operation between the test mode signal TM and the output voltage VOUT.

If the test mode signal TM is enabled by the above-mentioned structure, the fourth NMOS transistor N4 of the detection circuit 300b is turned on, such that the second voltage VPD2 is output as the voltage of the third node ND3. Therefore, during normal connection of the first pad 21, the voltage of the third node ND3 may have the ground voltage (VSS) level, the output voltage VOUT may have the power-supply voltage (VDD) level, and the defect detection signal VALERT may be at a low level. In contrast, during abnormal connection of the first pad 21, the voltage of the third node ND3 may have the power-supply voltage (VDD) level, the output voltage VOUT may have the ground voltage (VSS) level, and the defect detection signal VALERT may be at a high level.

Referring to FIG. 5, the detection circuit 300b may further include a second initialization circuit 310 having a fourth PMOS transistor P4 in which a gate terminal receives the test mode signal TM, a source terminal receives the power-supply voltage VDD, and a drain terminal is coupled to the third node ND3. In accordance with a present embodiment, the test mode signal TM may be used as the second initialization signal INIT2 of FIG. 2. As described above, the test mode signal TM transitions from a low level to a high level, and the PMOS transistor P4 may be turned on when the test mode signal TM is at a low level. Therefore, after the test mode signal TM operates the PMOS transistor P4 for a predetermined time, the test mode signal TM transitions to a high level and operates the detection circuit 300b (especially, the NMOS transistor N4), such that the test mode signal TM may be used as the second initialization signal INIT2. Therefore, before the test mode signal TM transitions to a high level, the fourth PMOS transistor P4 is turned on and the voltage of the third node ND3 is initialized to the power-supply voltage (VDD) level, such that the output voltage VOUT may be initialized to the ground voltage (VSS) level.

Referring to FIG. 5, the output circuit 400b may be a multiplexer MUX configured to select any one of the defect detection signal VALERT and the normal signal VNOR as a data DQ signal on the basis of the test mode signal TM to output the selected data DQ signal to the signal I/O pad. The normal signal VNOR may be any of signals other than the defect detection signal VALERT that is output through the signal I/O pad. For example, when the test mode signal TM is enabled, the output circuit 500b may output the defect detection signal VALERT to the signal I/O pad. When the test mode signal TM is disabled, the output circuit 500b may output the normal signal VNOR to the signal I/O pad.

FIG. 6 is a view illustrating a representation of an example of a table indicating operations or voltage levels of individual constituent elements of the semiconductor device 20b illustrated in FIG. 5.

First of all, for example, a case in which the first pad 21 is normally connected (bonded) to the ground-voltage supply line of the semiconductor substrate 120 will hereinafter be described with reference to the left side of FIG. 6.

When the first pad 21 is normally coupled to the ground-voltage supply line of the semiconductor substrate 120, the first voltage VPD1 may have the ground voltage (VSS) level. The third NMOS transistor N3 is turned on when the test mode signal TM is disabled, such that the first node ND1 is coupled to the second node ND2. Accordingly, the second voltage VPD2 may have the ground-voltage (VSS) level. The fourth PMOS transistor P4 is turned on when the test mode signal TM is disabled, the voltage of the third node ND3 may be initialized to the power-supply voltage (VDD) level and the output voltage VOUT may be initialized to the ground voltage level (VSS). In this case, since the fourth NMOS transistor N4 is turned off, the second voltage VPD2 may not be output to the third node ND3. Whereas the defect detection signal VALERT is at a high level because the output voltage VOUT is at the ground voltage (VSS) level, the test mode signal TM is disabled such that the multiplexer MUX may not output the defect detection signal VALERT.

If the test mode signal TM transitions from a low level to a high level, the third NMOS transistor N3 is turned off, such that the first node ND1 and the second node ND2 are separated from each other. The fourth NMOS transistor N4 is turned on, such that the second node ND2 is coupled to the third node ND3. Therefore, the second voltage VPD2 having the ground voltage (VSS) level may be output to the third node ND3, and the output voltage VOUT may have the power-supply voltage (VDD) level. In this case, the fourth PMOS transistor P4 may be turned off. Since the output voltage VOUT is at the power-supply voltage (VDD) level and the test mode signal TM is enabled, the defect detection signal VALERT may be at a low level. The multiplexer MUX may output a low-level defect detection signal VALERT to the signal I/O pad.

Subsequently, the other case in which the first pad 21 is abnormally connected (bonded) to the ground-voltage supply line of the substrate will hereinafter be described with reference to the right side of FIG. 6.

When the first pad 21 is abnormally coupled to the power-supply voltage supply line of the substrate 21, the first voltage VPD1 may be floated. The third NMOS transistor N3 is turned on when the test mode signal TM is disabled, and the first node ND1 is coupled to the second node ND2. Since the second voltage VPD2 is previously initialized to the power-supply voltage (VDD) level by the third PMOS transistor N1, the second voltage VPD2 may remain at the power-supply voltage (VDD) level even when the first node ND1 is coupled to the second node ND2. The fourth PMOS transistor P4 is turned on when the test mode signal TM is disabled, such that the voltage of the third node ND3 is initialized to the power-supply voltage (VDD) level and the output voltage VOUT is initialized to the ground voltage (VSS) level (i.e., a low level). In this case, the fourth NMOS transistor N4 is turned off, such that the second voltage VPD2 is not output to the third node ND3. Whereas the defect detection signal VALERT is at a high level because the output voltage VOUT has the ground voltage (VSS) level, the multiplexer MUX does not output the defect detection signal VALERT because the test mode signal TM is disabled.

When the test mode signal TM transitions from a low level to a high level, the third NMOS transistor N3 is turned off, such that the first node ND2 and the second node ND2 are separated from each other. The fourth NMOS transistor N2 is turned on, such that the second node ND2 is coupled to the third node ND3. Therefore, the voltage of the third node ND3 may remain at the power-supply voltage (VDD) level, and the output voltage VOUT may remain at the ground voltage (VSS) level (i.e., the low level). In this case, the fourth PMOS transistor P4 is turned off. Since the output voltage VOUT is at a low level and the test mode signal TM is enabled, the defect detection signal VALERT may be at a high level. The multiplexer MUX may output a high-level defect detection signal VALERT to the signal I/O pad.

As described above, assuming that the defect detection signal VALERT remains at a high level although the test mode signal TM transitions to an enabled state by the semiconductor device 20b of FIG. 5, the presence of a poor contact of the first pad 21 may be decided.

Figure 7A:
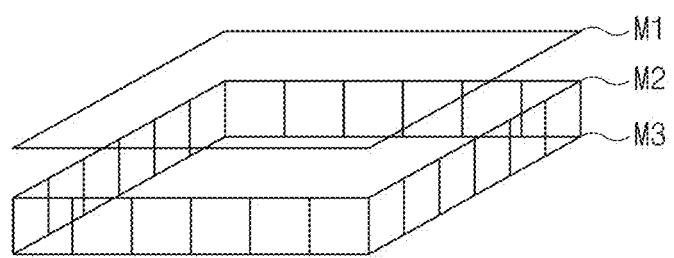
FIGS. 7A, 7B, and 7C illustrate a representation of examples of a first pad and a second pad according to an embodiment of the present disclosure.
Figure 7B:
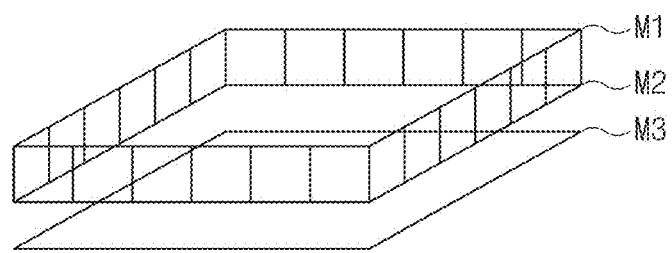
Figure 7C:
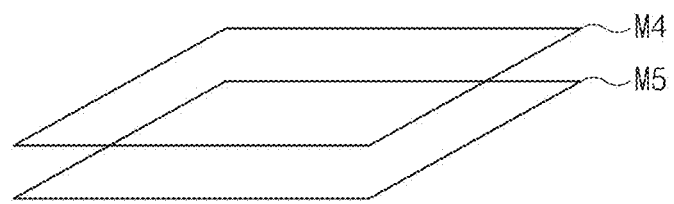

FIGS. 7A, 7B, and 7C illustrate representations of examples of a first pad and a second pad according to embodiments of the present disclosure.

In accordance with a present embodiment, the pad connected to the power-supply line may include a first pad 21 and a second pad 22 capable of being separated from each other. The pad (power pad) connected to the power-supply voltage supply line may be formed of three metal layers M1, M2, and M3 (See FIGS. 7A and 7B), or may be formed of two metal layers M4 and M5.

Referring to FIG. 7A, the first pad 21 may correspond to the first metal layer M1, and the second pad 22 may correspond to a connection structure of the second metal layer M2 and the third metal layer M3. Alternatively, as illustrated in FIG. 7B, the first pad 21 may correspond to a connection structure of the first metal layer M1 and the second metal layer M2, and the second pad 22 may correspond to the third metal layer M3. Alternatively, as illustrated in FIG. 7C, the first pad 21 may correspond to the fourth metal layer M4, and the second pad 22 may correspond to the fifth metal layer M5.

The above-mentioned description has disclosed explanations of the embodiments. For reference, the embodiments may include additional structures for better understanding of the disclosure as necessary although the additional structures are not directly associated with technical ideas of the present disclosure. In addition, the Active High or Active Low constructions for indicating deactivation states of a signal and circuit may be changed according to the embodiments. In order to implement the same function, a transistor structure may be modified as necessary. That is, the PMOS transistor and the NMOS transistor may be replaced with each other as necessary, and may be implemented using various transistors as necessary. The above-mentioned circuit modifications may be very frequently generated, such that a very high number of cases may exist and associated modification can be easily appreciated by those skilled in the art, and as such a detailed description thereof will herein be omitted for convenience of description.

As is apparent from the above description, the semiconductor devices according to the embodiments of the present disclosure can detect a poor contact of the power pad.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
    a first pad configured to provide a first voltage;
    a second pad;
    a connection circuit configured to couple the first pad to the second pad on the basis of a connection signal or electrically separate the second pad from the first pad on the basis of the connection signal; and
    a detection circuit configured to generate a defect detection signal on the basis of a test mode signal and a second voltage received from the second pad,
    wherein the defect detection signal is fixed to an enable level when the test mode signal is transitioned to an enable state on the condition that the first pad and the second pad are electrically separated from each other.

2. The semiconductor device according to claim 1, wherein the test mode signal is enabled after the connection signal is enabled.

3. The semiconductor device according to claim 1, wherein the connection signal is an inversion signal of the test mode signal.

4. The semiconductor device according to claim 1, wherein:
the first voltage provides a power-supply voltage; and
the connection circuit includes a PMOS transistor in which a gate terminal receives the connection signal, a source terminal is coupled to the second pad, and a drain terminal is coupled to the first pad.

5. The semiconductor device according to claim 1, wherein:
the first voltage provides a power-supply voltage; and
the connection circuit includes an NMOS transistor in which a gate terminal receives the connection signal, a source terminal is coupled to the second pad, and a drain terminal is coupled to the first pad.

6. The semiconductor device according to claim 1, wherein:
the first voltage provides a power-supply voltage; and
the detection circuit is configured to disable the defect detection signal when a voltage of the second pad is at a power-supply voltage level on the condition that the test mode signal is enabled.

7. The semiconductor device according to claim 6, wherein the detection circuit includes:
a PMOS transistor in which a gate terminal receives an inversion signal of the test mode signal, a drain terminal receives the voltage of the second pad, and a source terminal outputs an output voltage; and
a NAND operator configured to generate the defect detection signal by performing a NAND operation between the test mode signal and a level of the output voltage.

8. The semiconductor device according to claim 7, further comprising:
a first initialization circuit configured to set the voltage of the second pad to an opposite level of a voltage level provided from the first pad based on a first initialization signal; and
a second initialization circuit configured to initialize a source voltage of the PMOS transistor to a ground voltage level on the basis of a second initialization signal.

9. The semiconductor device according to claim 8, wherein the second initialization signal is identical to the inversion signal of the test mode signal.

10. The semiconductor device according to claim 8, wherein the second initialization circuit includes:
an NMOS transistor in which a gate terminal receives the second initialization signal, a source terminal receives a ground voltage, and a drain terminal is coupled to the source terminal of the PMOS transistor.

11. The semiconductor device according to claim 1, wherein:
the first voltage provides a ground voltage; and
the detection circuit is configured to disable the defect detection signal when a voltage of the second pad is at a ground voltage level on the condition that the test mode signal is enabled.

12. The semiconductor device according to claim 11, wherein the detection circuit includes:

an NMOS transistor in which a gate terminal receives the test mode signal and a source terminal receives the voltage of the second pad; and
a NAND operator configured to generate the defect detection signal by performing a NAND operation between the test mode signal and an inversion signal of a drain voltage level of the NMOS transistor.

13. The semiconductor device according to claim 12, further comprising:
a first initialization circuit configured to set the voltage of the second pad to an opposite level of a voltage level provided from the first pad based on a first initialization signal; and
a second initialization circuit configured to initialize a drain voltage of the NMOS transistor to a power-supply voltage level on the basis of a second initialization signal.

14. The semiconductor device according to claim 13, wherein the second initialization circuit includes:
a PMOS transistor in which a gate terminal receives the test mode signal, a source terminal receives a power-supply voltage, and a drain terminal is coupled to a drain terminal of the NMOS transistor.

15. The semiconductor device according to claim 8, wherein the first initialization signal is enabled before the test mode signal is enabled, and is disabled when the test mode signal is enabled.

16. The semiconductor device according to claim 8, wherein:
the first voltage provides a power-supply voltage; and
the first initialization circuit includes an NMOS transistor in which a gate terminal receives the first initialization signal, a source terminal receives a ground voltage, and a drain terminal is coupled to the second pad.

17. The semiconductor device according to claim 13, wherein:
the first voltage provides a ground voltage; and
the first initialization circuit includes a PMOS transistor in which a gate terminal receives an inversion signal of the first initialization signal, a drain terminal receives a power-supply voltage, and a source terminal is coupled to the second pad.

18. The semiconductor device according to claim 1, wherein:
each of the first pad and the second pad includes one or more metal layers.

19. The semiconductor device according to claim 1, wherein the first pad is configured to provide the first voltage based on contact between the first pad and a power-supply voltage supply line.

20. The semiconductor device according to claim 19, wherein the first voltage is floated when the first pad is abnormally coupled to the power-supply voltage supply line,
wherein the first voltage has a ground voltage level when the first pad is normally coupled to the power-supply voltage supply line and when the power-supply voltage supply line is connected to a ground-voltage supply line, and
wherein the first voltage has a power supply voltage level when the first pad is normally coupled to the power-supply voltage supply line and the power-supply voltage supply line is connected to a power-supply voltage.

* * * * *